United States Patent
Ledutke et al.

(10) Patent No.: US 9,698,070 B2
(45) Date of Patent: Jul. 4, 2017

(54) ARRANGEMENT HAVING A PLURALITY OF CHIPS AND A CHIP CARRIER, AND A PROCESSING ARRANGEMENT

(71) Applicant: Infineon Technologies AG, Neubiberg (DE)

(72) Inventors: Michael Ledutke, Saal (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 582 days.

(21) Appl. No.: 13/860,679

(22) Filed: Apr. 11, 2013

(65) Prior Publication Data

US 2014/0306356 A1   Oct. 16, 2014

(51) Int. Cl.

| H01L 23/28 | (2006.01) |
|---|---|
| H01L 23/31 | (2006.01) |
| H01L 21/66 | (2006.01) |
| H01L 21/56 | (2006.01) |
| H01L 21/673 | (2006.01) |

(52) U.S. Cl.
CPC ........ *H01L 23/3107* (2013.01); *H01L 21/561* (2013.01); *H01L 21/67336* (2013.01); *H01L 22/10* (2013.01); *H01L 22/32* (2013.01); *H01L 23/3121* (2013.01); *H01L 2924/0002* (2013.01)

(58) Field of Classification Search
CPC ... H01L 21/67336; H01L 22/10; H01L 22/32; H01L 23/3107; H01L 21/561; H01L 23/3121; H01L 23/544; H01L 21/3043; H01L 2223/54426; H01L 21/56; H01L 21/563; H01L 23/3178; H01L 23/315; H01L 23/3185
See application file for complete search history.

(56) References Cited

U.S. PATENT DOCUMENTS

| 4,899,195 | A | | 2/1990 | Gotoh | |
|---|---|---|---|---|---|
| 5,824,457 | A | * | 10/1998 | Liu et al. | ...................... 430/394 |
| 6,103,554 | A | * | 8/2000 | Son | ................. H01L 23/3107 257/687 |
| 6,638,450 | B2 | * | 10/2003 | Richard | ............. B29D 11/0073 264/1.32 |
| 7,608,481 | B2 | * | 10/2009 | Masuda | ................ H01L 21/561 257/E25.006 |
| 2001/0041513 | A1 | * | 11/2001 | Nishi | ...................... B24B 9/065 451/44 |
| 2004/0157410 | A1 | * | 8/2004 | Yamaguchi | ....... H01L 23/49805 438/460 |
| 2004/0178514 | A1 | * | 9/2004 | Lee | ........................ H01L 21/565 257/787 |
| 2007/0148918 | A1 | * | 6/2007 | Kinsman | ................ H01L 21/561 438/460 |

(Continued)

FOREIGN PATENT DOCUMENTS

CN   1531041 A   9/2004

*Primary Examiner* — Khiem D Nguyen
(74) *Attorney, Agent, or Firm* — Viering, Jentschura & Partner MBB

(57) ABSTRACT

In various embodiments, an arrangement is provided. The arrangement may include a plurality of chips; a chip carrier carrying the plurality of chips, the chip carrier including a chip carrier notch; and encapsulation material encapsulating the chip carrier and filling the chip carrier notch; wherein the outer circumference of the encapsulation material is free from a recess.

15 Claims, 7 Drawing Sheets

(56) References Cited

U.S. PATENT DOCUMENTS

| | | | |
|---|---|---|---|
| 2008/0014677 A1* | 1/2008 | Xiaochun | H01L 23/3114 438/106 |
| 2008/0176491 A1 | 7/2008 | Sekiya | |
| 2009/0102070 A1* | 4/2009 | Feger | H01L 21/563 257/797 |
| 2009/0194865 A1* | 8/2009 | Sekiguchi | H01L 21/561 257/692 |
| 2013/0193564 A1* | 8/2013 | Liu et al. | 257/632 |

* cited by examiner

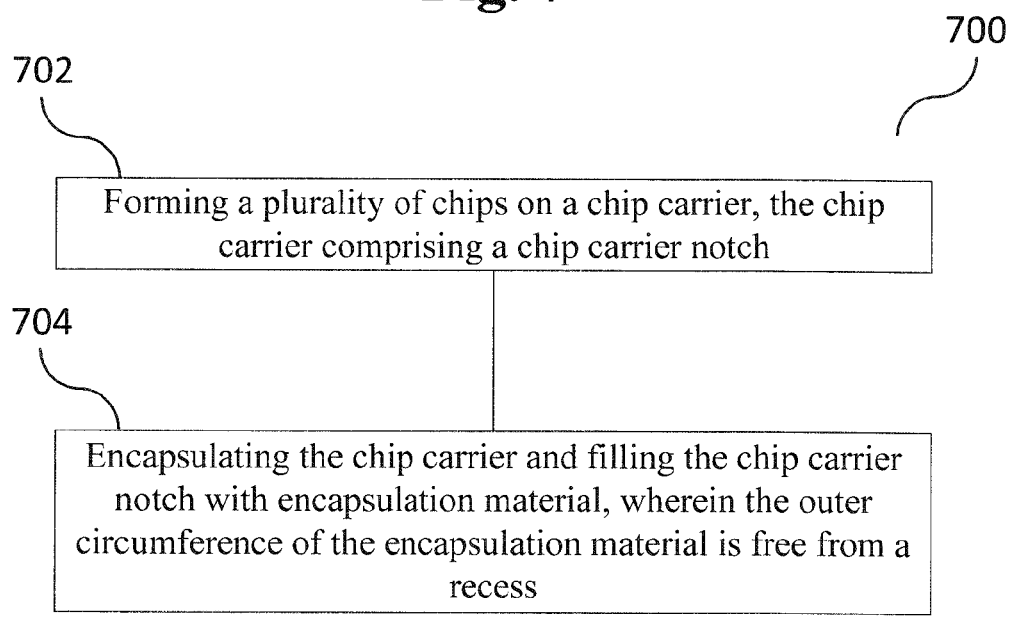
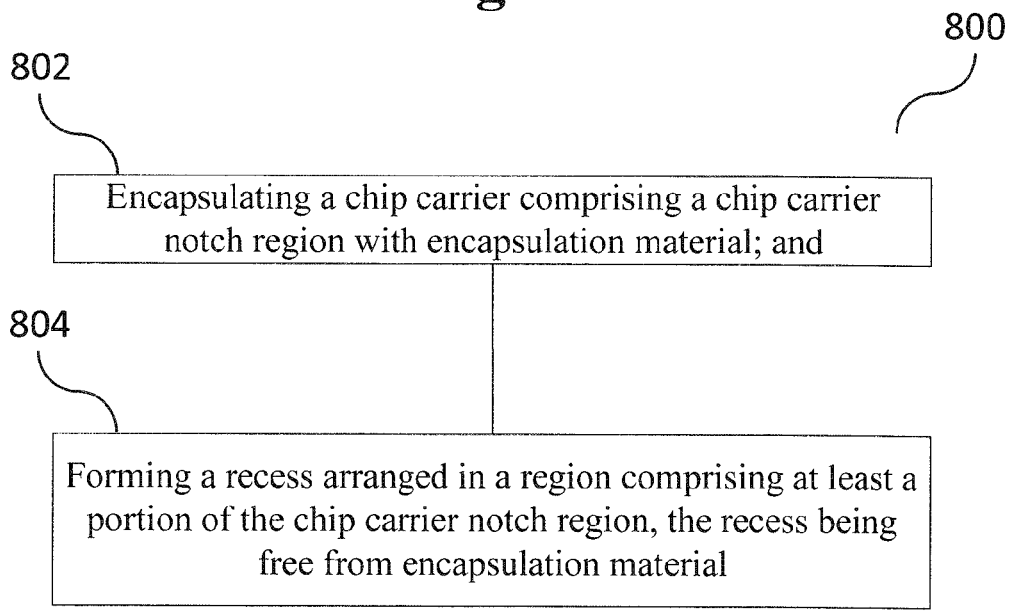

… (US 9,698,070 B2)

ARRANGEMENT HAVING A PLURALITY OF CHIPS AND A CHIP CARRIER, AND A PROCESSING ARRANGEMENT

TECHNICAL FIELD

Various embodiments relate generally to an arrangement having a plurality of chips and a chip carrier, and a processing arrangement.

BACKGROUND

Chip carrier molding (e.g. compression molding and transfer molding) provides a manufacturing method to create thick layers (>50 μm) on the front and/or back side of a chip carrier. Chip carrier molding is used broadly in several manufacturing processes in the industry, such as for the purposes to serve as a protection layer, a carrier, and/or a functional layer.

Another conventional method to encapsulate a chip carrier is the so-called full wafer molding, wherein the chip carrier is encapsulated by an encapsulation material on at least five sides in case of a rectangle shaped chip carrier. The full chip carrier molding usually provides the capability for thinning chip dies below a thickness of 200 μm.

SUMMARY

In various embodiments, an arrangement is provided. The arrangement may include a plurality of chips; a chip carrier carrying the plurality of chips, the chip carrier comprising a chip carrier notch; and encapsulation material encapsulating the chip carrier and filling the chip carrier notch; wherein the outer circumference of the encapsulation material is free from a recess.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a block diagram of a method for manufacturing said arrangement according to an embodiment; and FIG. 8 shows a block diagram of a method for manufacturing said arrangement according to an embodiment.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may provide a simple and affordable orientation mark and/or alignment mark within one process step.

Various embodiments may provide a simple mold tool with less fabrication tolerances.

Various embodiments may provide a sealing of at least one side of a chip carrier by means of encapsulation material across the entire chip carrier.

Various embodiments may simplify locating the chip carrier inside the mold tool due to no longer need to observe the rotation of the rotation of the chip carrier and/or the chip carrier notch.

Various embodiments may provide a more accurate pre-alignment in the frontend processes due to an alignment of the chip carrier and not within the encapsulation material compound. Thus, the orientation and/or alignment mark and the detection method according to various embodiments may increase the accuracy and speed of the alignment process.

Illustratively, various embodiments may generate a (temporary) carrier or carrier system in the context of chip manufacturing providing a very simple orientation or alignment marking.

In various embodiments, the encapsulation material may also serve as an insulator in the field of power devices such as e.g. power semiconductors.

Figure 1:
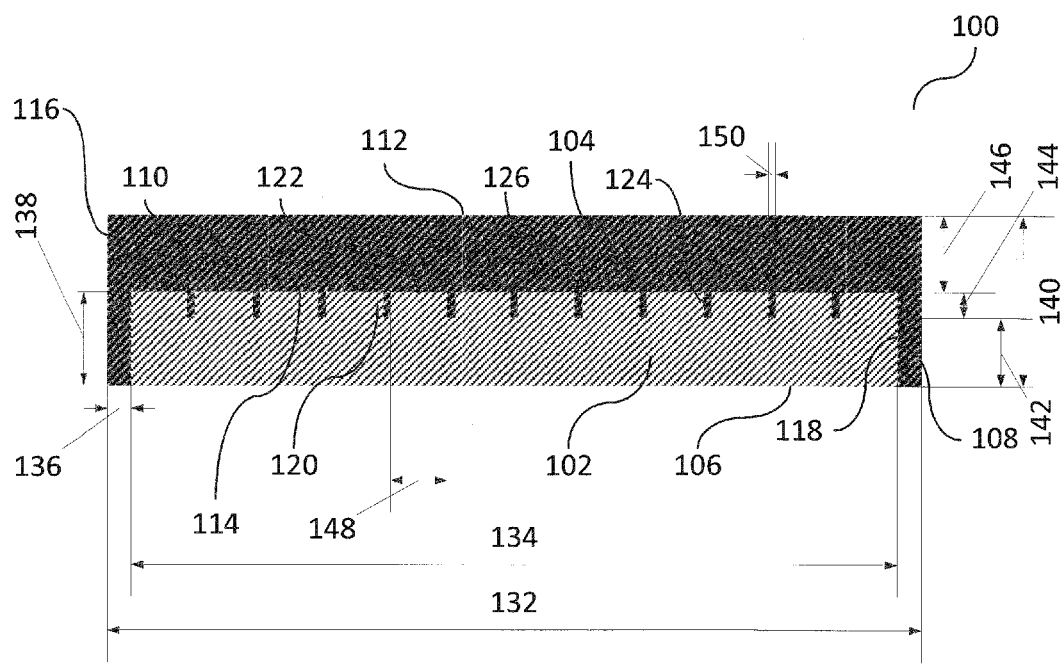
FIG. 1 shows a cross-sectional view of an arrangement according to an embodiment.

FIG. 1 shows a cross-sectional view of an arrangement 100. The arrangement 100 may have at least a chip carrier 102, a plurality of chips 120 formed on the chip carrier 102, and encapsulation material 110 at least partially encapsulating the plurality of chips 120 and the chip carrier 102 on at least three sides of said chip carrier 102.

The arrangement 100 may have a lateral extension (or in case of a disc-like shaped this extension may be the diameter of the arrangement 100) which may be referred to as the diameter 132 of the arrangement 100.

The arrangement 100 may have a vertical extension (or in other words the thickness of the arrangement 100) which may be referred to as the thickness 140 of the arrangement 100.

The plurality of chips 120 may be formed on at least one side of the chip carrier 102. Preferably, the plurality of chips may be integrated monolithically in the chip carrier (wafer). The side on which said plurality of 120 chips may be formed may be referred to as a first main side (which may also be referred to as front side) 104 of the chip carrier 102. The chip carrier 102 may have a second side (which may also be referred to as back side) which is free from any chip, wherein the chip-free second side may be a second main side 106.

The first main side 104 and the second main side 106 may be located on opposite sides of said chip carrier 102. The chip carrier 102 may have at least one chip carrier sidewall 108. Depending on the shape of the chip carrier 102, the chip carrier 102 may have more than one chip carrier sidewalls 108. It should be noted that in various embodiments, the electronic components or circuits may be arrange on the first main side 104.

Although the chip carrier 102 may be formed in a disc-like shape (e.g. as a wafer), but it is not limited to a disc-like shape, the chip carrier 102 may be formed in any polygonal shape such as in a circular, triangular, trapezoidal, rectangular, ellipsoidal, or any other suitable polygonal shape.

The chip carrier 102 may extend laterally wherein the lateral extension may be in a range from about 1 mm up to about 500 mm. For the sake of simplicity, within the following description the case for a circular shaped chip carrier 102 will be discussed. Thus, the lateral extension (or diameter) of the chip carrier 102 may be referred to as the diameter 134.

The chip carrier 102 may extend vertically (or in other words, the chip carrier 102 may have a thickness) and thus, the chip carrier 102 may have a thickness (which may referred to as the thickness 142) which may extend vertically between the first main side 104 and the second main side 106.

The chip carrier 102 may be a wafer, an embedded encapsulation chip carrier, a printed circuit board, an interposer structure and the like. In various embodiments the chip carrier 102 may be formed to carry a plurality of the same or of different semiconductor structures such as e.g. dies, any type of integrated circuit, and/or any other suitable electronic device or semiconductor structure.

The chip carrier 102 may be formed of a semiconductor material. The semiconductor material may include or be formed of at least one of silicon (Si), silicon carbide (SiC), gallium arsenide (GaAs), gallium antimonide (GaSb), gallium nitride (GaN), silicon germanium (SiGe), and indium phosphide (InP). The chip carrier 102 may be formed from a single crystalline or from a mixture of semiconductor compounds. Furthermore, any combination of the semiconductor compounds may be used as wafer material. Moreover, the wafer may itself be formed from or include an encapsulation material, e.g. a composite wafer (e.g. Cu elements in a mold compound or cooling bodies in a mold compound or an electric coil in a mold compound, and the like) or embedded wafer.

The chip carrier 102 may be formed from metallised films and foils. The metallization of the films and foils for the chip carrier 102 may include or be formed of at least one from the following group of materials, the group of materials consisting of: copper, nickel, iron, copper alloy, nickel alloy, iron alloy, aluminum, and aluminum alloy. Moreover, the chip carrier 102 may be formed from or include a ceramic material.

The films and foils for the metallization of the chip carrier 102 may include or be formed of at least one from the following group of materials, the group of materials consisting of: Polypropylene PP, Polyethylene terephthalate, Polyester PET, Polyethylene naphthalate PEN, Polyphenylene sulfide PPS, Polytetrafluoroethylene PTFE, Polystyrene PS, and Polycarbonate PC.

In various embodiments, the chip carrier may be formed from a glass such as any conventional glass wafer.

The plurality of chips 120 formed on the chip carrier 102 may include or be formed by chips 120 that may be formed in any rectangular shape and may any dimensions which may be smaller than or equal to the dimensions of the lateral extension of the chip carrier 102.

The plurality of chips 120 formed on the chip carrier 102 may be formed by a front-end-of-line (FEOL) method on the chip carrier 102.

The plurality of chips 120 formed on the chip carrier 102 may be formed in any array structure. Furthermore, kerfs 126 may be formed in the chip carrier 102 between the chips 120. It is to be noted that in various embodiments, the kerfs 126 may also be omitted.

Such structuring of a chip array by kerfs 126 between the chip carrier 102 may be formed by means of etching (e.g. plasma etching), mechanical sawing, laser cutting, or any other suitable method to remove material of the chip carrier 102 between the individual chips 120 to form respective trenches 126 of a predetermined depth (which may be referred to as the depth 144 of the kerfs 126) into the chip carrier 120.

The depth 144 of the kerfs 126 may also define the thickness of the plurality of chips 120 on the first main side 104 of the chip carrier 102.

Due to the structuring of the chip carrier 102 by means of the kerfs 126, the chips may have a lateral extension which may be referred to as the width 148. Moreover, due to the structuring of the chip carrier 102 by the kerfs 126, the kerfs 126 may form a lateral distance between any of the chips 120 which may be referred to as the distance 150 which extends laterally between two individual chip sidewalls 124.

Each chip 120 on the chip carrier 102 may have (due to exposing by the kerfs 126) at least four sides which may be referred to as sidewalls 124 of the chips 120. Moreover, each chip 120 on the chip carrier 102 may have a side (which may be referred to as the top side 122 of the chips 120) that may be facing away from the chip carrier first main side 104 and thus, may not be in a physical contact with the first main side 104 of the chip carrier 102.

The plurality of chips 120 may be uniformly distributed on the first main side 104 of the chip carrier 102, but also any other distribution of the plurality of chips 120 on the first main side 104 of the chip carrier 102 may also be provided.

In various embodiments, the plurality of chips 120 formed on the chip carrier 102 may be monolithically integrated with the chip carrier 102 and may have been formed using conventional front end processing carried out on the chip carrier 102 (which may in this case a wafer 102).

In various embodiments, the plurality of chips 120 formed on the chip carrier 102 may be prefabricated and may be subsequently placed on the chip carrier 102 by a place-and-pick process. Furthermore, the positioning of the chips 120 may be in an array structure on the chip carrier 102, e.g. in rows and columns, alternatively in any other regular or irregular structure.

Each chip 120 of the plurality of chips 120 may have a side which may be referred to as a back side of the chip (not shown) that is in physical contact with the chip carrier 102.

The plurality of chips 120 formed on the chip carrier 102 and the chip carrier 102 may extend vertically which may be defined by a vertical extension (which may be referred to as the thickness 138 of the plurality of chips 120 formed on the chip carrier 102 and the chip carrier 102) between the second main side 104 of the chip carrier 102 and the top side 122 of the chips 120.

The plurality of chips 120 may be formed as a semiconductor structure which may be formed to have one or more electronic devices or any type of integrated circuit or any other suitable electronic device or semiconductor structure. The plurality of chips 120 may have a power semiconductor device, wherein the power semiconductor device may include at least one power semiconductor device from the group consisting of: a power transistor, e.g. a power field effect transistor (e.g. a power metal oxide semiconductor (MOS) field effect transistor), a power bipolar transistor, a power insulated gate bipolar transistor (IGBT), a thyristor, a MOS controlled thyristor, a silicon controlled rectifier, a power Schottky diode, a silicon carbide diode, a gallium nitride device, and/or a semiconductor logic device, wherein the semiconductor logic device or memory device may include at least one semiconductor logic device or memory device from the group consisting of: an application-specific integrated circuit (ASIC), a driver, a controller, e.g. a logic control transistor, a sensor.

The encapsulation material 110 may be formed on a prefabricated arrangement, wherein the prefabricated arrangement may be formed by the chip carrier 102 and the plurality of chips 120 on the first main side 104 of the chip carrier 102. The encapsulation material 110 may at least cover partially the plurality of chips 120 which may be provided on the first main side 104 of the chip carrier 102, the chip carrier 102 as well as the sidewalls 108 of the chip carrier 102.

The encapsulation material 110 may at least partially fill the kerfs 126 between the plurality of chips 120 formed on or in the chip carrier 102.

The encapsulation material 110 may have a side (which may be referred to as the top side 112 of the encapsulation material 110) which may be located opposite to the second main side 106 of the chip carrier 102 and may have no physical contact to the chip carrier 102.

The encapsulation material 110 may have a side (which may be referred to as the inner back side 114 of the encapsulation material 110) which may be in a direct physical contact with the top side 122 of the chip 120, the first main side 104 of the chip carrier 102, and the sidewalls 124 of the chips 120.

The encapsulation material 110 may have a side (which may be referred to as the inner sidewall(s) 118 of the encapsulation material 110) which may be in a direct physical contact with the sidewall(s) 108 of the chip carrier 102.

The encapsulation material 110 may have a side (which may be referred to as the outer sidewalls(s) 116 of the encapsulation material 110) which may be located opposite of the sidewall(s) 108 of the chip carrier 102 and the outer sidewalls(s) 116 may have no physical contact to the chip carrier 102.

Forming the encapsulation material 110 onto the plurality of chips 120 on the first main side 104 of the chip carrier 102 may form a layer with a vertical extension of the encapsulation material 110 which may be referred to as the top thickness 146 of the encapsulation material 110. The top thickness 146 may be defined by the vertical extension between the top side 112 of the encapsulation material 110 and the top side of the plurality of chips 120 on the first main side 104 of the chip carrier 102.

The encapsulation material 110 may be formed so that the encapsulation material 110 congruently encapsulates the shape of the chip carrier 102, wherein the lateral extension of the encapsulation material 110 is larger than the lateral extension of the chip carrier 102. The encapsulation material 110 may form due to the at least partial encapsulation of the sidewall(s) 108 of the chip carrier 102 a protruding perimeter around the chip carrier 102. The encapsulation material 110 may extend at least partially from the sidewall(s) 108 of the chip carrier 102 with a thickness which may be in a range from about 100 µm to about 3 mm, e.g. about 400 µm to about 1 mm. This lateral extension (or thickness) of the encapsulation material 110 from the sidewall(s) 108 of the chip carrier 102 may be referred to as the lateral thickness 136.

The encapsulation material 110 may be formed from a material at least among Polyester resin, Vinyl ester resin, synthetic resin, fiberglass, epoxy, polymer, silicone, polyimide, thermoplast and/or any other suitable encapsulation material and/or combinations of any of the mentioned materials. The encapsulation material 104 may be formed from a combination of said materials.

Due to the different materials that may be used for forming the chip carrier 102 and the encapsulation material 110, the materials may have different optical colors. The encapsulation material 108 may be formed to have additional pigments or may be colored by its compounds within forming said encapsulation material 110 to increase the differing optical effect between the material of the chip carrier 102 and the encapsulation material 110. In one embodiment, the encapsulation material 108 may have a dark coloring, for example, the encapsulation may have, but is not limited to, at least one color of the colors black, grey, brown, and the like. Any other suitable color may be used for the encapsulation material 110 to provide a detectable "color" difference. The different colors of the encapsulation material 110 and the chip carrier 102 may be selected to increase an optical contrast between the encapsulation material 110 and the chip carrier 102. The different coloring may be formed to increase an optical contrast that may improve a detection of a chip carrier notch by an optical detector. The optical contrast between the encapsulation material 110 and the chip carrier 102 may be provided for detecting a chip carrier notch which may be used as an orientation mask and/or position mark during a subsequent processing of the chip carrier arrangement 100. The detection of the chip carrier notch by a chip carrier notch position detector which will be described in more detail below.

The encapsulation material 110 may be applied onto the chip carrier 102 by at least one of the following methods: compression molding, transfer molding and/or injection molding.

Figure 2:
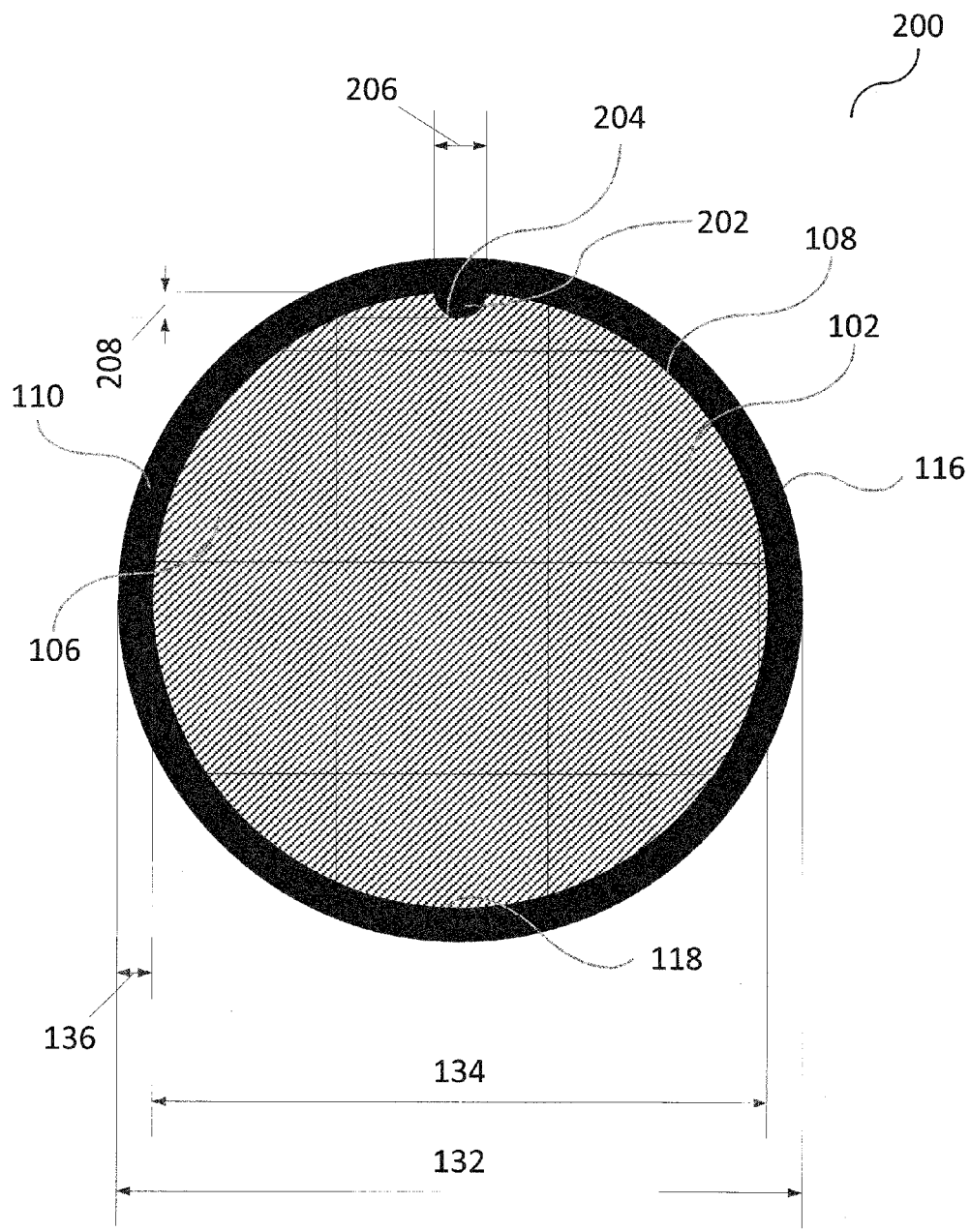
FIG. 2 shows a bottom view of various arrangements according to various embodiments.

FIG. 2 shows a bottom view of an arrangement 200 which may be based on the arrangement 100 as described above. The arrangement 200 may have the same features and functionalities as the arrangement 100 of FIG. 1 as already described above. The arrangement 200 may have at least a chip carrier 102 with a plurality of chips 120 on the first main side 104 of the chip carrier 102 (not shown in FIG. 2), encapsulation material 110 at least partially encapsulating the sidewall(s) 108 of the chip carrier 102 and the first main side 104 where the chip carrier 102 may have the plurality of chips 120, and a chip carrier notch 202 wherein the outer circumference of the encapsulation material 110 is free from a recess, e.g. free from an alignment mark recess and/or an orientation mark recess. In other words, no recess is formed in the encapsulation material 110, but a recess is formed in the chip carrier 102 itself (e.g. the chip carrier notch 202), and the recess is at least partially (e.g. conformally) filled with encapsulation material 110.

Thus, a chip carrier notch 202 may be formed into the chip carrier 102. The chip carrier notch 202 may be formed to extend at least partially from the sidewall 108 of the chip carrier 102 into the body of the chip carrier 102. The chip carrier notch 202 may be formed to extend at least partially from the first main side 104 of the chip carrier 102 throughout the entire chip carrier 102 up to the second main side 106.

Forming the chip carrier notch 202 into the chip carrier 202 may form a side which may be referred to as the sidewall(s) 204 of the recess chip carrier notch 202.

The chip carrier notch 202 may be formed in any polygonal shape. Thus, the number of the sidewalls 204 may depend on the shape of the chip carrier notch 202.

Forming the chip carrier notch 202 into the chip carrier 202 may form a lateral extension which may be referred to as the width 206 of the chip carrier notch 202

Forming the chip carrier notch 202 into the chip carrier 202 may form a vertical extension which may be referred to as the depth 208 of the chip carrier notch 202

In FIG. 2, the chip carrier notch 202 is shown, but should not be limited to, as a semicircle-shaped chip carrier notch 202 that may be formed to extend from the sidewall 106 of the chip carrier 102 into the chip carrier 102 and may extend from the first main side 104 of the chip carrier 102 throughout the entire chip carrier 102 up to the second main side 106 of the chip carrier 102. The chip carrier notch 202 may be substantially free from chip carrier material. The chip carrier notch 202 may be formed in any polygonal shape such as in a circular, triangular, trapezoidal, rectangular, ellipsoidal, trench-like or any other suitable polygonal shape. For the sake of simplicity, within the following description the case for a circular-shaped chip carrier notch 202 will be discussed.

The size of the chip carrier notch 202 may be selected by any optically detectable size (area, portion) with respect to on the one hand a position where e.g. the plurality of chips 120 on the first main side 104 of the chip carrier 102 may not be negatively impacted, and on the other hand a position that may allow a chip carrier notch position detector, that may be configured to detect optically the position of said chip carrier notch 202. The chip carrier notch position detector will be described below.

The chip carrier notch 202 may be formed by means of mechanical sawing, laser cutting, etching, and/or any other suitable method for forming such a chip carrier notch 202 into said chip carrier 102.

The chip carrier notch 202 may be formed at any position into the perimeter of the chip carrier 102 with respect to prevent a negative impact to the plurality of chips 120 on the first main side 104 of the chip carrier 102. In various embodiments, the chip carrier notch 202 may be formed at a position into the perimeter where no chips may be formed on the first main side 104 of the chip carrier 102.

Figure 3:
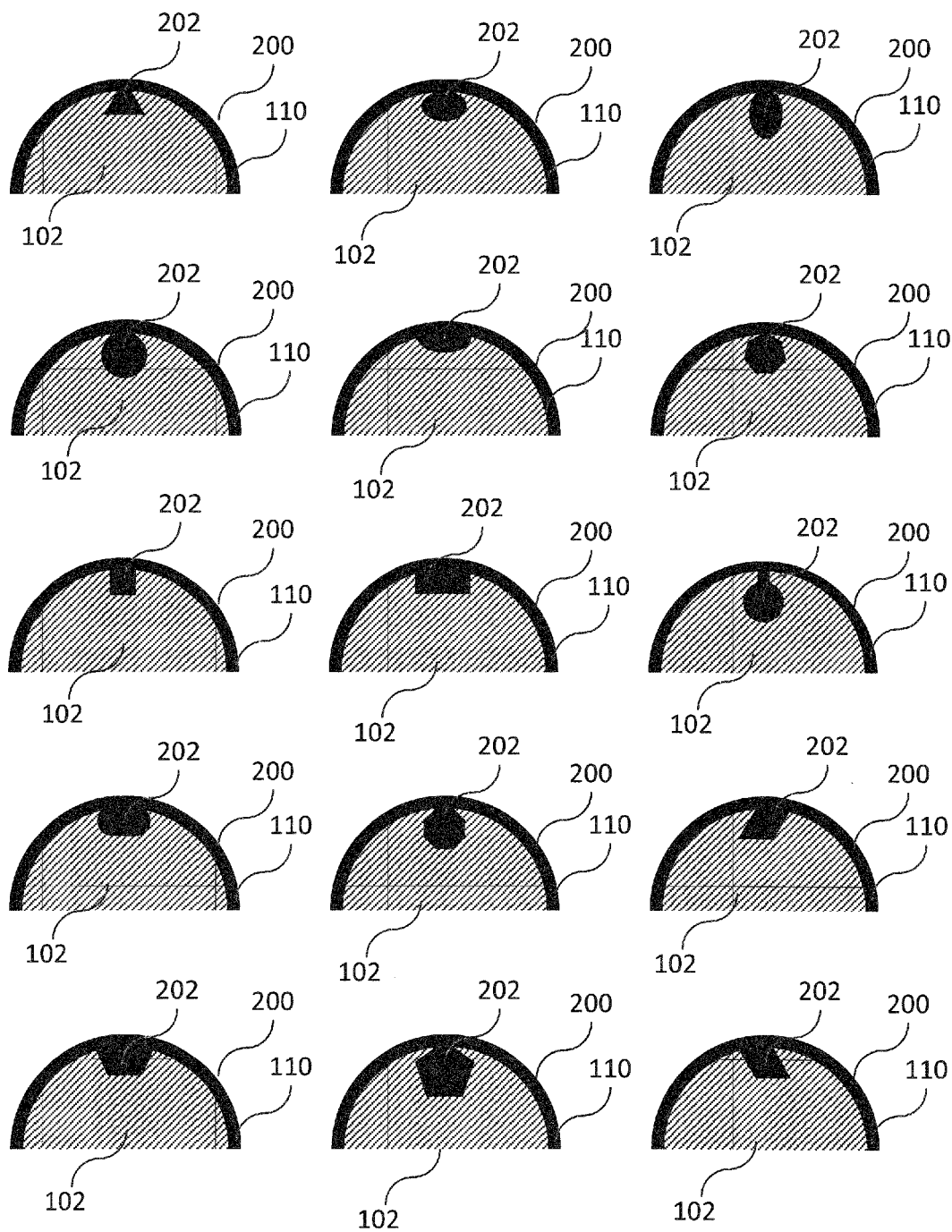
FIG. 3 shows a bottom view of an arrangement according to an embodiment.

In various embodiments, in contrast to FIG. 3 showing a plurality of examples of different shapes of respectively (exactly) one chip carrier notch 202 in each chip carrier 102, more than one chip carrier notches 202 may be formed at various positions into the perimeter of the respective chip carrier 102 extending from the sidewall(s) 108 of the chip carrier 102 into the chip carrier 102. A plurality of chip carrier notches 202 may be formed into the perimeter of the chip carrier 102 extending from the sidewall(s) 108 of the chip carrier 102 into the chip carrier 102. The number of chip carrier notches 202 may be selected with respect to the purpose of an additional need of positioning and/or orientation marks in the processing of the arrangement 200.

The encapsulation material 110 may be formed to encapsulate (and e.g. fill) at least partially the chip carrier notch 202 so that the encapsulation material 110 may partially or completely fill the chip carrier notch 202. In various embodiments, the chip carrier notch 202 may be completely filled by the encapsulation material 110.

The encapsulation material 110 may be formed in accordance with the shape of the at least partially encapsulated chip carrier 102 without a chip carrier notch 202.

The encapsulation material 110 may be formed to have a different color compared to the material of the chip carrier 102. Either the encapsulation material 110 may be formed to have a darker color compared to the material of the chip carrier 102 or the encapsulation material 110 may be formed to have a brighter color compared to the material of the chip carrier 102. The contrast between the both materials, the encapsulation material 110 and the material of the chip carrier 102, may be selected by means of forming an optimized contrast between the encapsulation material 110 and the material of the chip carrier 102. In various embodiments, the encapsulation material 110 may have a substantially black color and the material of the chip carrier 102 may have a metallic shiny color.

The contrast between the encapsulation material 110 and the material of the chip carrier 102 may improve the optical detectability by a chip carrier notch position detector which may be used to detect the chip carrier notch 202 that may be at least partially filled by the encapsulation material 110. The chip carrier notch position detector will be described in more detail below.

FIG. 3 shows a bottom view of various embodiments of various shapes of the chip carrier notch 202 according the arrangement 200 as already described above.

The embodiments according to the arrangement 200 are not limited to the shown shapes of the chip carrier notch 202. The chip carrier notch 202 may be formed in any polygonal shape such as in a circular, triangular, trapezoidal, rectangular, ellipsoidal, trench-like or any other suitable polygonal shape In FIG. 3 the exemplary shapes of the chip carrier notch 202 are shown as being formed in a triangular, ellipsoidal, circular, hexagonal, quadratic, rectangular, combination of a rectangle and a circle, octagonal, trapezoidal, trench-like, pentagonal, and in a combination of two circles and a rectangle.

Also, any other suitable polygonal shape may be formed into the chip carrier 102 to serve at the at least one chip carrier notch 202 used as an orientation and/or position marker during the subsequent manufacturing processes.

Moreover, it is shown in FIG. 3 that any polygonal shape may be formed wherein the shape of the chip carrier notch 202 may be formed in any orientation into the chip carrier 102 to serve as at least one chip carrier notch 202 used as an orientation and/or position marker during the subsequent manufacturing process.

Figure 4:
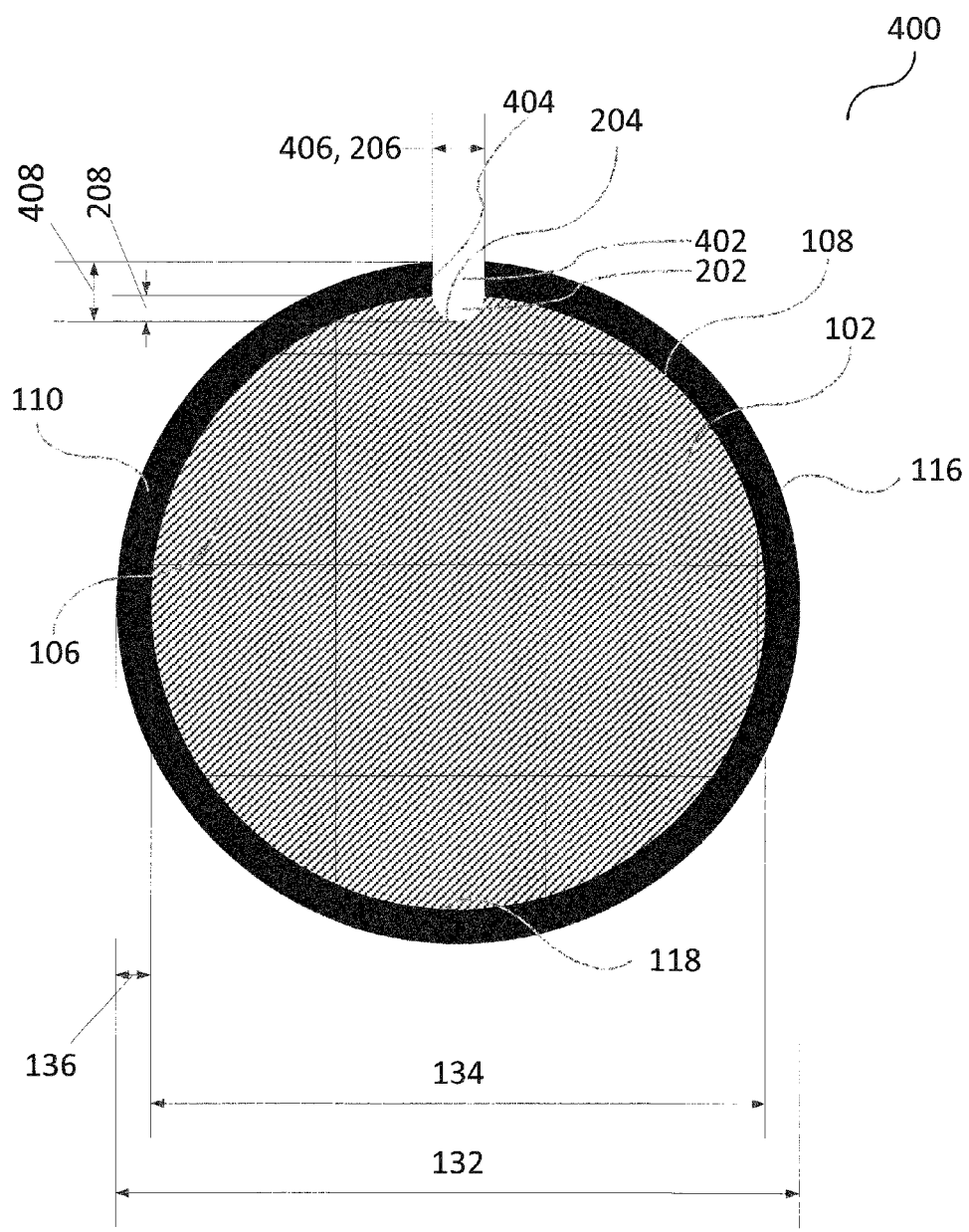
FIG. 4 shows a bottom view of an arrangement according to an embodiment.

FIG. 4 shows a bottom view of an arrangement 400 which may be based on the arrangement 100 and the arrangement 200 as described above. The arrangement 400 may have the same features and functionalities as the arrangement 100 of FIG. 1 and the arrangement 200 of FIGS. 2 and 3 as already described above. The arrangement 400 may have at least a chip carrier 102 with a plurality of chips 120 on the first main side 104 of the chip carrier 102 (not shown in FIG. 4), encapsulation material 110 at least partially encapsulating the sidewall(s) 108 of the chip carrier 102 and the first main side 104 on which the chip carrier 102 may have a plurality of chips 120 (not shown in FIG. 4), a chip carrier notch 202, and a recess 402.

The recess 402 may be formed at least partially into the encapsulation material 110 which may be formed according to the arrangement 200. The recess 402 may be formed to extend from the outer sidewall(s) 116 of the encapsulation material 110 into at least the encapsulation material.

In yet another embodiment, the recess 402 may be formed at least partially into the encapsulation material 110 and the chip carrier 102 which may be formed according to the arrangement 200. The recess 402 may be formed to extend from the outer sidewall(s) 116 of the encapsulation material 110 into at least the encapsulation material and at least into the chip carrier 102.

In another embodiment, the recess 402 may be formed at least partially into the encapsulation material 110 which may be formed according to the arrangement 200. The recess 402 may be formed to extend from the outer sidewall(s) 116 of the encapsulation material 110 into at least the encapsulation material up to the chip carrier 102.

The recess 402 may extend at least partially from the top side 112 of the encapsulation material 110 up to at least partially the second main side 106 of the chip carrier 102. The recess 402 may be substantially free from encapsulation material 110 and from material of the chip carrier 102.

Forming the recess 402 into at least the encapsulation material 110 and/or the chip carrier 102 may form a side which may be referred to as the sidewall(s) 404 of the recess 402.

Forming the recess 402 into at least the encapsulation material 110 and/or the chip carrier 102 may form a lateral extension which may be referred to as the width 406 of the recess 402.

Forming the recess 402 into at least the encapsulation material 110 and/or the chip carrier 102 may form a vertical extension which may be referred to as the depth 408 of the recess 402.

The shown exemplary embodiments according to the arrangement 200 are not limited to the shown shapes of the chip carrier notch 202. The chip carrier notch 202 may be formed in any polygonal shape such as in a circular, triangular, trapezoidal, rectangular, ellipsoidal, trench-like or any other suitable polygonal shape.

In FIG. 4 an exemplary semicircle-like shape of the recess 402 is shown, but it is not limited to that shape. The recess 402 may be formed in any polygonal shape such as in a triangular, ellipsoidal, circular, hexagonal, quadratic, rectangular, combination of a rectangle and a circle, octagonal, trapezoidal, trench-like, pentagonal, in a combination of two circles and a rectangle, and in any other suitable polygonal shape.

Furthermore, any other suitable polygonal shape may be formed into at least the encapsulation material 110 and/or the chip carrier 102 to serve as the at least one recess 402 used as an orientation and/or position marker during the subsequent manufacturing processes.

Although only one recess 402 is shown in FIG. 4, also more than one recess 402 may be formed into at least the encapsulation material 110 and/or the chip carrier 102.

In another embodiment a plurality of recesses 402 may be formed into at least the encapsulation material 110 and/or the chip carrier 102.

Although the recess 402 is shown in FIG. 4 as being formed into the chip carrier notch 202, the recess 402 may be formed at any position into the perimeter of the arrangement 400 wherein the recess 402 may extend from the outer sidewall(s) 116 of the encapsulation material 110 into at least partially the encapsulation material 110 and/or the chip carrier 102. In various embodiments, at a position where the plurality of chips 120 on the first main side 104 of the chip carrier 102 may not be negatively impacted.

In case, that the recess 402 may extend throughout the entire arrangement 400 an optical contrast between the chip carrier and the encapsulation material 110 may not be visible anymore. Therefore, the contrast may be formed by an underlying contrary colored carrier of the arrangement 400. The color of the underlying colored carrier may be selected by means of forming an optimized contrast between the encapsulation material 110 and the material of the chip carrier 102. The selection may be similar to the selection of the color for the encapsulation material 110 and the color for the material of the chip carrier 102 as mentioned above.

Figure 5:
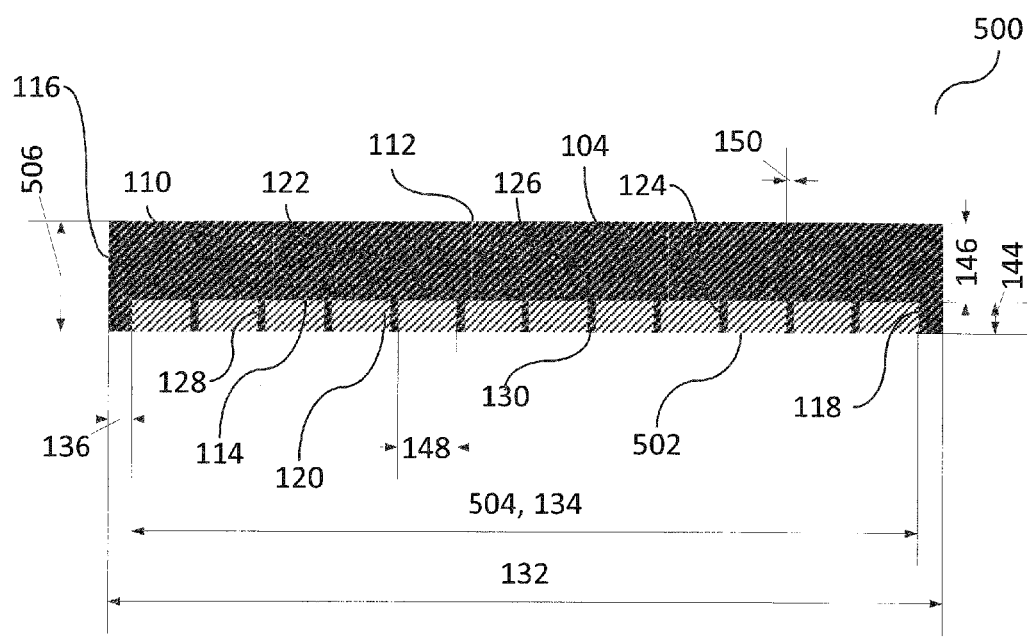
FIG. 5 shows a cross-sectional view of an arrangement according to an embodiment.

FIG. 5 shows a cross-sectional view of an arrangement 500, which may be based on the arrangement 100, the arrangement 200, and the arrangement 400 as described above, wherein the arrangement 500 of FIG. 5 shows an arrangement that is based on the arrangements 100, 200, and/or 400 after a (backside) thinning process of anyone of the arrangements 100, 200, and/or 400. The arrangement 500 may have at least the same features and functionalities as any of the arrangement 100 of FIG. 1, the arrangement 200 of FIGS. 2 and 3, and/or the arrangement 400 of FIG. 4 as already described above. The arrangement 500 may have at least a plurality of chips 120, an encapsulation material 110 at least partially encapsulating the sidewall(s) 124 of the plurality of chips 120, the top side 122 of the plurality of chips, and the gaps (formerly the kerfs 126) between the individual chips 120, a chip carrier notch 202, and/or a recess 402.

After one of the arrangements 100, 200, and/or 400 may be thinned from the second main side 104 of the chip carrier 102 so that the entire chip carrier (or in other words the complete chip carrier material represented by the thickness 142 of the chip carrier 102 is removed from any of the arrangements 100, 200, and/or 400) may be substantially free from chip carrier material. However, the plurality of chips 102 are still held together by means of the encapsulation material 110, which illustratively serves as an auxiliary carrier.

The plurality of chips 120 may be diced into individual chips 120 wherein any individual chip 120 may be encapsulated on at least its top side 122 of the chips 120 and on at least one sidewall 124 of the chips 120 by the encapsulation material 110.

Thinning of at least one of the arrangements 100, 200, and/or 400 may form a side at the plurality of chips 120, which may be referred as a back side 502 of the plurality of chips 120.

The back side 502 of the plurality of chips 120 may be due to the thinning process substantially free from any encapsulation material 110 and/or material of the chip carrier 102.

The arrangement of the plurality of chips 120 in the encapsulation material may form a lateral extension which may be referred as a distance 504 of the arrangement 500.

The arrangement of the plurality of chips 120 in the encapsulation material may form a vertical extension which may be referred as a distance 506 of the arrangement 500.

The arrangement 500 may be provided for a subsequent dicing of the encapsulation material 110 to form individual chips 120.

Figure 6:
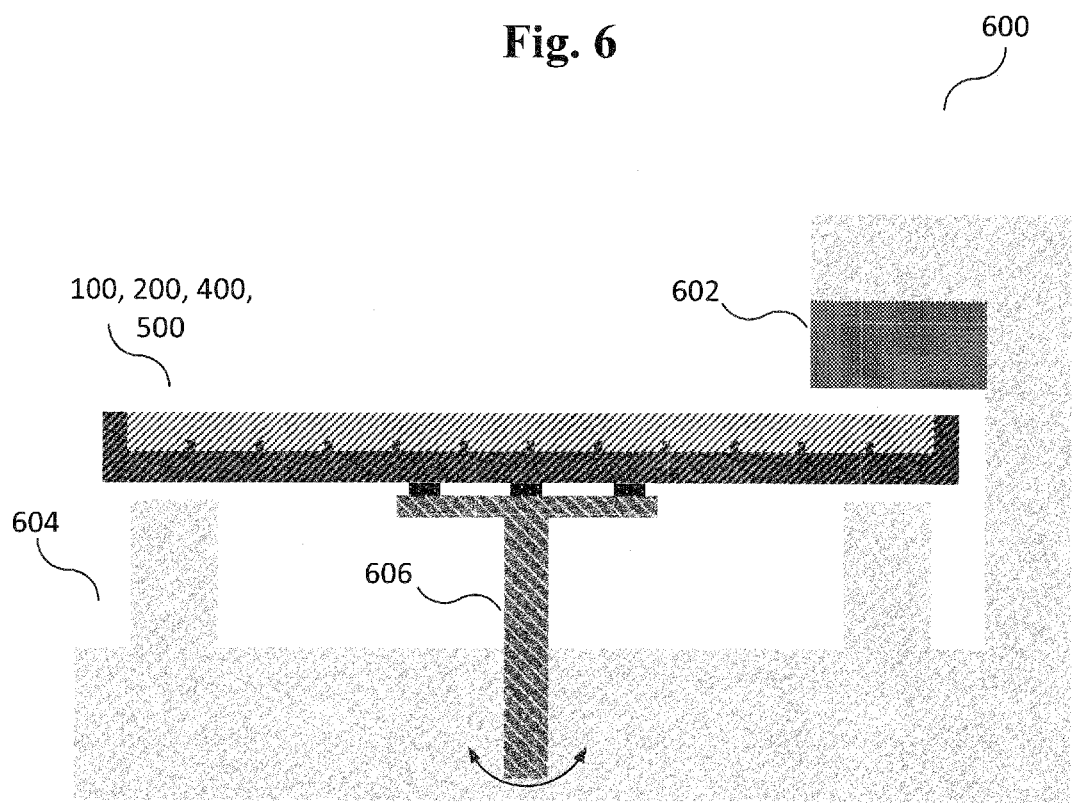
FIG. 6 shows a cross-sectional view of an processing arrangement according to an embodiment.

FIG. 6 shows a cross-sectional view of a processing arrangement 600 according to an embodiment. The processing arrangement 600 may have inserted at least the chip carrier 102 that may carry the plurality of chips 120, wherein the chip carrier 102 includes the chip carrier notch 202 and/or a recess 402. The processing arrangement 600 includes a chip carrier notch position detector (which may be referred to as the chip carrier notch position detector 602) that may be configured to detect the position of the chip carrier notch 202 and/or the recess 402.

The processing arrangement 600 may have at least a carrier structure 606 wherein the carrier structure 604 may have at least a carrier 606 that may allow to carry at least one of the arrangements 100, 200, 400 and/or 500 and that may allow to rotate at least one of the arrangements 100, 200, 400 and/or 500 in front of the chip carrier notch position detector 602.

The carrier 606 may hold at least one of the arrangements 100, 200, 400 and/or 500. The carrier 606 may hold at least one of the arrangements 100, 200, 400 and/or 500 on the top side 112 of the encapsulation material 110 so that the second main side 106 of the chip carrier 102 may not be in a physical contact with the rotatable arrangement carrier 606. The carrier structure 604 may have at least one chip carrier notch position detector 602, but it is not limited to that number. Furthermore, more than one chip carrier notch position detector 602 may be formed in the carrier structure 604. The carrier structure 604 may have at least a plurality of chip carrier notch position detectors 602.

The chip carrier notch position detector 602 may be located so that the perimeter of at least one of the arrangements 100, 200, 400 and/or 500 may be optically detectable by the chip carrier notch position detector 602. The chip carrier notch position detector 602 may have dimensions that may be larger than the chip carrier notch 202 and/or the recess 402. At least one of the arrangements 100, 200, 400 and/or 500 may be rotated by the carrier 606 in front of the chip carrier notch position detector 602, wherein the second main side 106, 502 of the chip carrier 102 may be oriented opposite to the chip carrier notch position detector 602 and the chip carrier notch position detector 602 may be configured to optically detect the chip carrier notch 202 and/or the recess 402.

The chip carrier notch position detector 602 may be formed to detect the position of either the chip carrier notch 202 or the chip carrier notch 202 and the recess 402 by means of a light reflection by the chip carrier 102.

The chip carrier notch position detector 602 may have at least one camera to detect the at least one position of either the chip carrier notch 202 or the chip carrier notch 202 and the recess 402 by means of a light reflection by the chip carrier 102.

The chip carrier notch position detector 602 may have at least a two-dimensional imaging array to detect the at least one position of either the chip carrier notch 202 or the chip carrier notch 202 and the recess 402 by means of a light reflection by the chip carrier 102.

The processing arrangement 600 may have at least the carrier 606 that may carry at least one of the arrangements 100, 200, 400 and/or 500, and a chip carrier notch position detector 602 that may be configured to detect the at least one position of either the chip carrier notch 202 or the chip carrier notch 202 and the recess 402, wherein the chip carrier notch position detector 602 may have an imaging array processor that may process a reflected image of at least a portion of the chip carrier 102.

FIG. 7 shows a block diagram an examplary method 700 for forming an arrangement 200 based on the features and functionalities of the arrangement 200 as described above, according to various embodiments.

The first step 702 of the exemplary method 700 may include forming a plurality of chips on a chip carrier, the chip carrier comprising a chip carrier notch.

The second step 704 of the exemplary method 700 may include encapsulating the chip carrier and filling the chip carrier notch with encapsulation material, wherein the outer circumference of the encapsulation material is free from a recess, e.g. free from an alignment mark recess and/or an orientation mark recess.

FIG. 8 shows a block diagram an examplary method 800 for forming an arrangement 400 based on the features and functionalities of the arrangement 400 as described above, according to various embodiments.

The first step 802 of the exemplary method 800 may include encapsulating a chip carrier comprising a chip carrier notch region with encapsulation material.

The second step 804 of the exemplary method 800 may include forming a recess arranged in a region comprising at least a portion of the chip carrier notch region, the recess being free from encapsulation material.

According to an embodiment, the arrangement may have a plurality of chips, a chip carrier carrying a plurality of chips, wherein the chip carrier may have a chip carrier notch, an encapsulation material encapsulating the chip carrier and filling the chip carrier notch, wherein the outer circumference of the encapsulation material is free from a recess, e.g. free from an alignment mark recess and/or an orientation mark recess.

According to an embodiment, the chip carrier is a wafer and the plurality of chips may be monolithically integrated in the wafer. According to an embodiment, the chip carrier may be an embedded encapsulation chip carrier. According to an embodiment, the chip carrier may be a printed circuit board. According to an embodiment, the chip carrier may be an interposer structure. The chip carrier may have a polygonal shape. The encapsulation material may at least partially cover a first main side and at least one sidewall of the chip carrier. Furthermore, the encapsulation material may at least partially cover a second main side of the chip carrier being opposite the first main side of the chip carrier. According to an embodiment, the lateral extension of the encapsulation material may be larger than the lateral extension of the chip carrier.

According to various embodiments, an arrangement may have a chip carrier that may have a chip carrier notch region, an encapsulation material that may encapsulate the chip carrier, and a recess that may be arranged in a region which may have at least a portion of the chip carrier notch region and the recess being free from encapsulation material.

The chip carrier may be a wafer, wherein the plurality of chips may be monolithically integrated in the wafer. The chip carrier may be an embedded encapsulation chip carrier. Furthermore, the chip carrier may be a printed circuit board. Furthermore, the chip carrier may be an interposer structure. According to an embodiment, the chip carrier may have a polygonal shape. The encapsulation material may at least partially cover a first main side and at least one sidewall of the chip carrier. Moreover, the encapsulation material may at least partially cover a second main side of the chip carrier being opposite the first main side of the chip carrier. The lateral extension of the encapsulation material may be larger than the lateral extension of the chip carrier.

According to various embodiments, a processing arrangement may have a carrier configured to carry a chip carrier, an arrangement, that may have a plurality of chips, a chip carrier carrying the plurality of chips, the chip carrier comprising a chip carrier notch, an encapsulation material encapsulating the chip carrier and filling the chip carrier notch, wherein the outer circumference of the encapsulation material is free from a recess (e.g. free from an alignment mark recess and/or an orientation mark recess), and a chip carrier notch position detector configured to detect the position of the chip carrier notch.

According to an embodiment, the processing arrangement may have a chip carrier notch position detector, wherein the chip carrier notch position detector is configured to detect the position of the chip carrier notch based on light reflected by the chip carrier. Furthermore, the chip carrier notch position detector may include at least one camera. According to an embodiment, the chip carrier notch position detector may include a two-dimensional imaging array. The processing arrangement may include a carrier configured to carry a chip carrier, an arrangement that may have a chip carrier that may have a chip carrier notch region, encapsulation material encapsulating the chip carrier, a recess arranged in a region including at least a portion of the chip carrier notch region, the recess being free from encapsulation material, and a chip carrier notch position detector configured to detect the position of the recess.

According to an embodiment, the chip carrier notch position detector may be configured to detect the position of the recess based on light reflected by the chip carrier. The chip carrier notch position detector may include at least one camera. Furthermore, the chip carrier notch position detector may include a two-dimensional imaging array.

According to an embodiment, a processing arrangement may have a carrier configured to carry a chip carrier, a chip carrier position detector configured to detect the position of the chip carrier notch; wherein the chip carrier notch position detector may have an imaging array processor processing a reflected image of at least a portion of the wafer.

Various embodiments may provide a method for manufacturing an arrangement, wherein the method may include: forming a plurality of chips on a chip carrier, the chip carrier including a chip carrier notch; and encapsulating the chip carrier and filling the chip carrier notch with encapsulation material, wherein the outer circumference of the encapsulation material is free from a recess, e.g. free from an alignment mark recess and/or an orientation mark recess.

The chip carrier may be a wafer and the plurality of chips may be monolithically integrated in the wafer. The chip carrier may also be an embedded encapsulation chip carrier. Furthermore, the chip carrier may be a printed circuit board or an interposer structure. Moreover, the chip carrier may have a polygonal shape. Various embodiments may provide the method for manufacturing an arrangement, wherein the encapsulation material is formed to at least partially cover a first main side and at least one sidewall of the chip carrier. The encapsulation material may be formed to at least partially cover a second main side of the chip carrier being opposite the first main side of the chip carrier. The lateral extension of the encapsulation material may be formed to be larger than the lateral extension of the chip carrier. The encapsulating the chip carrier and filling the chip carrier notch with encapsulation material may be carried out by means of encapsulation, e.g. molding, e.g. compression molding, transfer molding or injection molding. Furthermore, the encapsulating the chip carrier and filling the chip carrier notch with encapsulation material may be carried out by means of transfer molding.

Various embodiments may provide a method for manufacturing an arrangement The method may include: encapsulating a chip carrier including a chip carrier notch region with encapsulation material; and forming a recess arranged in a region including at least a portion of the chip carrier notch region, the recess being free from encapsulation material.

The chip carrier may be a wafer and the plurality of chips may be monolithically integrated in the wafer. In various embodiments, the chip carrier may be an embedded encapsulation chip carrier. As an alternative, the chip carrier may be a printed circuit board or an interposer structure. The chip carrier may have a polygonal shape. The encapsulation material may be formed to at least partially cover a first main side and at least one sidewall of the chip carrier. Furthermore, the encapsulation material may be formed to at least partially cover a second main side of the chip carrier being opposite the first main side of the chip carrier. The lateral extension of the encapsulation material may be formed to be larger than the lateral extension of the chip carrier. Furthermore, the encapsulating a chip carrier including a chip carrier notch region with encapsulation material may be carried out by means of encapsulation, e.g. molding, e.g. compression molding, transfer molding or injection molding. Encapsulating a chip carrier including a chip carrier notch region with encapsulation material may also be carried out by means of transfer molding.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An arrangement, comprising:
   a plurality of chips;
   a chip carrier carrying the plurality of chips,
   the chip carrier comprising a chip carrier notch extending from a lateral perimeter of the chip carrier into the chip carrier; and
   an encapsulation material encapsulating the chip carrier and
   filling the chip carrier notch;
   wherein an outer circumference of the encapsulation material is free from a recess.

2. The arrangement of claim 1,
   wherein the outer circumference of the encapsulation material is free from an alignment mark recess.

3. The arrangement of claim 1,
   wherein the chip carrier is a wafer;
   wherein the plurality of chips is monolithically integrated in the wafer.

4. The arrangement of claim 1,
   wherein the chip carrier is an embedded encapsulation chip carrier.

5. The arrangement of claim 1,
   wherein the chip carrier is a printed circuit board.

6. The arrangement of claim 1,
   wherein the chip carrier is an interposer structure.

7. The arrangement of claim 1,
   wherein the chip carrier has a polygonal shape.

8. The arrangement of claim 1,
   wherein the encapsulation material at least partially covers a first main side and at least one sidewall of the chip carrier.

9. The arrangement of claim 8,
   wherein the encapsulation material at least partially covers a second main side of the chip carrier being opposite the first main side of the chip carrier.

10. The arrangement of claim 1,
    wherein a lateral extension of the encapsulation material is larger than a lateral extension of the chip carrier.

11. A processing arrangement, comprising:
    a carrier configured to carry a chip carrier;

an arrangement, comprising:
  a plurality of chips;
  the chip carrier carrying the plurality of chips, the chip carrier comprising a chip carrier notch extending from a lateral perimeter of the chip carrier into the chip carrier;
  an encapsulation material encapsulating the chip carrier and filling the chip carrier notch,
    wherein an outer circumference of the encapsulation material is free from a recess;
a chip carrier notch position detector configured to detect a position of the chip carrier notch.

12. The processing arrangement of claim 11,
wherein the chip carrier notch position detector is configured to detect the position of the chip carrier notch based on light reflected by the chip carrier.

13. The processing arrangement of claim 11,
wherein the chip carrier notch position detector comprises at least one camera.

14. The processing arrangement of claim 11,
wherein the chip carrier notch position detector comprises a two-dimensional imaging array.

15. An arrangement, comprising:
a plurality of chips;
a chip carrier carrying the plurality of chips, the chip carrier comprising a chip carrier notch; and
an encapsulation material encapsulating the chip carrier and filling the chip carrier notch, wherein a lateral extension of the encapsulation material is larger than a lateral extension of the chip carrier;
wherein an outer circumference of the encapsulation material is free from a recess.

* * * * *